United States Patent
Thatcher et al.

(10) Patent No.: US 8,261,158 B2
(45) Date of Patent: Sep. 4, 2012

(54) APPARATUS, SYSTEM, AND METHOD FOR USING MULTI-LEVEL CELL SOLID-STATE STORAGE AS SINGLE LEVEL CELL SOLID-STATE STORAGE

(75) Inventors: Jonathan Thatcher, Liberty Lake, WA (US); David Flynn, Sandy, UT (US); Ethan Barnes, Pleasant Grove, UT (US); John Strasser, Syracuse, UT (US); Robert Wood, Nwot, CO (US); Michael Zappe, Arvada, CO (US)

(73) Assignee: Fusion-io, Inc., Salt Lake City, UT (US)

( * ) Notice: Subject to any disclaimer, the term of this patent is extended or adjusted under 35 U.S.C. 154(b) by 324 days.

(21) Appl. No.: 12/724,401

(22) Filed: Mar. 15, 2010

(65) Prior Publication Data

US 2010/0235715 A1 Sep. 16, 2010

Related U.S. Application Data

(60) Provisional application No. 61/160,258, filed on Mar. 13, 2009.

(51) Int. Cl.
*G11C 29/00* (2006.01)

(52) U.S. Cl. ........................ 714/763; 714/819

(58) Field of Classification Search ............. 365/185.24, 365/230.03, 185.03; 714/782, 774, 810, 714/763, 819
See application file for complete search history.

(56) References Cited

U.S. PATENT DOCUMENTS

| | | | |
|---|---|---|---|
| 5,515,317 A | 5/1996 | Wells et al. | |
| 5,541,886 A | 7/1996 | Hasbun | |
| 6,097,637 A * | 8/2000 | Bauer et al. ............. | 365/185.24 |
| 6,125,072 A * | 9/2000 | Wu ........................... | 365/230.03 |
| 6,895,543 B2 * | 5/2005 | Hazama .................... | 714/773 |
| 7,133,311 B2 * | 11/2006 | Liu ............................ | 365/168 |
| 7,257,027 B2 | 8/2007 | Park | |
| 7,272,041 B2 | 9/2007 | Rahman et al. | |
| 7,301,807 B2 * | 11/2007 | Khalid et al. ........... | 365/185.03 |
| 7,369,434 B2 | 5/2008 | Radke | |
| 7,466,575 B2 | 12/2008 | Shalvi et al. | |

(Continued)

OTHER PUBLICATIONS

Chang, Hybrid Solid-State Disks: Combining Heterogenous NAND Flash in Large SSDs, Design Automation Conference, Mar. 21-24, 2008 pp. 428-433, ASPDAC 2008, Asia and South Pacific, downloaded Mar. 22, 2009 from IEEE Xplore.

(Continued)

*Primary Examiner* — David Ton
(74) *Attorney, Agent, or Firm* — Jeffrey T. Holman

(57) ABSTRACT

An apparatus, system, and method are disclosed for storing information in a storage device that includes multi-level memory cells. The method involves storing data that is written to the storage device in the LSBs of the multi-level memory cells, and storing audit data in the MSBs of the multi-level memory cells. The audit data can be read separately from the data and used to determine whether or not there has been any unintended drift between states in the multi-level cells. The audit data may be used to correct data when the errors in the data are too numerous to be corrected using error correction code (ECC). The audit data may also be used to monitor the general health of the storage device. The monitoring process may run as a background process on the storage device. The storage device may transition the multi-level memory cells to operate as single-level memory cells.

25 Claims, 8 Drawing Sheets

U.S. PATENT DOCUMENTS

| | | | |
|---|---|---|---|
| 7,466,597 | B2 | 12/2008 | Kim |
| 7,593,263 | B2 | 9/2009 | Sokolov et al. |
| 7,646,636 | B2 * | 1/2010 | Kim .......................... 365/185.03 |
| 7,697,326 | B2 | 4/2010 | Sommer et al. |
| 7,706,182 | B2 | 4/2010 | Shalvi et al. |
| 7,751,240 | B2 | 7/2010 | Shalvi |
| 7,773,413 | B2 | 8/2010 | Shalvi |
| 7,821,826 | B2 | 10/2010 | Shalvi et al. |
| 7,848,141 | B2 | 12/2010 | Seong et al. |
| 7,864,573 | B2 | 1/2011 | Perlmutter et al. |
| 7,881,107 | B2 | 2/2011 | Shalvi |
| 7,900,102 | B2 | 3/2011 | Sokolov et al. |
| 7,941,592 | B2 | 5/2011 | Bonella et al. |
| 8,036,030 | B2 | 10/2011 | Seong et al. |
| 2006/0028875 | A1 | 2/2006 | Avraham et al. |
| 2007/0132452 | A1 | 6/2007 | Alsop |
| 2007/0132453 | A1 | 6/2007 | Ogino |
| 2007/0132456 | A1 | 6/2007 | Salman et al. |
| 2007/0132457 | A1 | 6/2007 | Okamoto et al. |
| 2007/0132458 | A1 | 6/2007 | Allen, Jr. |
| 2007/0260817 | A1 | 11/2007 | Ha |
| 2008/0026203 | A1 | 1/2008 | Gates et al. |
| 2008/0053472 | A1 | 3/2008 | Hadden |
| 2008/0053473 | A1 | 3/2008 | Lee |
| 2008/0055987 | A1 * | 3/2008 | Ruf et al. .................. 365/185.09 |
| 2008/0068747 | A1 | 3/2008 | Sasaki et al. |
| 2008/0080250 | A1 | 4/2008 | Lee |
| 2008/0111058 | A1 | 5/2008 | Feldman et al. |
| 2008/0126680 | A1 | 5/2008 | Lee et al. |
| 2008/0126686 | A1 | 5/2008 | Sokolov et al. |
| 2008/0130341 | A1 | 6/2008 | Shalvi et al. |
| 2008/0139441 | A1 | 6/2008 | Xiao et al. |
| 2008/0148115 | A1 | 6/2008 | Sokolov et al. |
| 2008/0158958 | A1 | 7/2008 | Sokolov et al. |
| 2008/0172520 | A1 | 7/2008 | Lee |
| 2008/0172521 | A1 | 7/2008 | Lee |
| 2008/0181001 | A1 | 7/2008 | Shalvi |
| 2008/0198650 | A1 | 8/2008 | Shalvi et al. |
| 2008/0198652 | A1 | 8/2008 | Shalvi et al. |
| 2008/0215930 | A1 | 9/2008 | Radke |
| 2008/0219050 | A1 | 9/2008 | Shalvi et al. |
| 2008/0263262 | A1 | 10/2008 | Sokolov et al. |
| 2008/0282106 | A1 | 11/2008 | Shalvi et al. |
| 2008/0288716 | A1 | 11/2008 | Arakawa |
| 2009/0024905 | A1 | 1/2009 | Shalvi et al. |
| 2009/0037691 | A1 | 2/2009 | Master et al. |
| 2009/0043951 | A1 | 2/2009 | Shalvi et al. |
| 2009/0046509 | A1 | 2/2009 | Annavajjhala et al. |
| 2009/0049366 | A1 * | 2/2009 | Toda ............................... 714/782 |
| 2009/0050703 | A1 | 2/2009 | Lifson et al. |
| 2009/0063450 | A1 | 3/2009 | Petri |
| 2009/0091979 | A1 | 4/2009 | Shalvi |
| 2009/0103358 | A1 | 4/2009 | Sommer et al. |
| 2009/0106485 | A1 | 4/2009 | Anholt |
| 2009/0144600 | A1 | 6/2009 | Perlmutter et al. |
| 2009/0157964 | A1 | 6/2009 | Kasorla et al. |
| 2009/0158126 | A1 | 6/2009 | Perlmutter et al. |
| 2009/0168524 | A1 | 7/2009 | Golov et al. |
| 2009/0187803 | A1 | 7/2009 | Anholt et al. |
| 2009/0193184 | A1 | 7/2009 | Yu et al. |
| 2009/0199074 | A1 | 8/2009 | Sommer |
| 2009/0213653 | A1 | 8/2009 | Perlmutter et al. |
| 2009/0213654 | A1 | 8/2009 | Perlmutter et al. |
| 2009/0228761 | A1 | 9/2009 | Perlmutter et al. |
| 2009/0240872 | A1 | 9/2009 | Perlmutter et al. |
| 2009/0244963 | A1 | 10/2009 | Karpov et al. |
| 2009/0327590 | A1 | 12/2009 | Moshayedi |
| 2010/0091535 | A1 | 4/2010 | Sommer et al. |
| 2010/0110787 | A1 | 5/2010 | Shalvi et al. |
| 2010/0115376 | A1 | 5/2010 | Shalvi et al. |
| 2010/0122016 | A1 | 5/2010 | Marotta et al. |
| 2010/0124088 | A1 | 5/2010 | Shalvi et al. |
| 2010/0131826 | A1 | 5/2010 | Shalvi et al. |
| 2010/0131827 | A1 | 5/2010 | Sokolov et al. |
| 2010/0153632 | A1 | 6/2010 | Lee et al. |
| 2010/0157641 | A1 | 6/2010 | Shalvi et al. |
| 2010/0157675 | A1 | 6/2010 | Shalvi et al. |
| 2010/0165689 | A1 | 7/2010 | Rotbard et al. |
| 2010/0165730 | A1 | 7/2010 | Sommer et al. |
| 2010/0195390 | A1 | 8/2010 | Shalvi |
| 2010/0199150 | A1 | 8/2010 | Shalvi et al. |
| 2010/0205352 | A1 | 8/2010 | Chu et al. |
| 2010/0220509 | A1 | 9/2010 | Sokolov et al. |
| 2010/0220510 | A1 | 9/2010 | Shalvi |
| 2010/0226165 | A1 | 9/2010 | Kang et al. |
| 2010/0250836 | A1 | 9/2010 | Sokolov et al. |
| 2010/0332955 | A1 | 12/2010 | Anholt |
| 2011/0013451 | A1 | 1/2011 | Han |
| 2011/0292725 | A1 | 12/2011 | Choi et al. |
| 2012/0020155 | A1 | 1/2012 | Kim |

OTHER PUBLICATIONS

Cho, A Dual-Mode NAND Flash Memory: 1-Gb Multilevel and High-Performance 512-Mb Single-Level Modes, IEEE Journal of Solid-State Circuits, Nov. 2001, pp. 1700-1706, vol. 36, No. 11.

Probabilistic Error Correction in Multi-Bit-Per-Cell Flash Memory, IP.com Prior Art Database Technical Disclosure, IPCOM000141833D, Oct. 16, 2006.

Multi-Bit-Per-Cell Flash Memory Device with Non-Bijective Mapping, IP.com Prior Art Database Technical Disclousre, IPCOM00141835D, Oct. 16, 2006.

Method of Error Correction in a Multi-Bit-Per-Cell Flash Memory, IP.com Prior Art Database Technical Disclosure, IPCOM000147010D, Mar. 4, 2007.

SLC vs. MLC: An Analysis of Flash Memory, Examining the Quality of Memory: Understanding the Differences between Flash Grades, Super*Talent The Best Memory, Super Talent The Best Memory, SLC vs MLC: Whitepaper, San Jose CA, downloaded on Mar. 13, 2009.

ASPMC_660, Asine Group, http://www.asinegroup.com/products/aspmc660.html, copyright 2002, downloaded on Nov. 18, 2009.

BiTMICRO Introduces E-Disk PMC Flash Disk Module at Military & Aerospace Electronics East, May 18, 2004, BiTMICRO, http://www.bitmicro.com/press_news_releases_20040518_prt.php.

NAND Flash 101: An Introduction to NAND Flash and How to Design It in to Your Next Product, Micron, pp. 1-28, Micron Technology Nov. 2006.

Harris "PCM Flash Killer or Flash Road Kill?" Storage Bits, available at http://www.zdnet.com/blog/storage/pcm-flash-killer-or-flash-road-kill/1080, last accessed Jul. 10, 2012, 3 pages.

Qureshi et al. "Morphable Memory System: A Robust Architecture for Exploiting Multi-Level Phase Change Memories" Proceedings of the 37th Annual International Symposium on Computer Architecture, pp. 153-162.

Yaakobi et al. "Efficient Coding Schemes for Flash Memories" Flash Memory Summit (Aug. 2010), 142 pages.

Zhang et al "Characterizing and Mitigating the Impact of Process Variations on Phase Change Based Memory Systems" Proceedings of the 42nd Annual IEEE/ACM International Symposium on Microarchitecture, 12 pages.

Raz Dan and Rochelle Singer, "Implementing MLC NAND Flash for Cost-Effective, High-Capacity Memory", White Paper M-Systems, Sep. 2003, pp. 1-13.

* cited by examiner

APPARATUS, SYSTEM, AND METHOD FOR USING MULTI-LEVEL CELL SOLID-STATE STORAGE AS SINGLE LEVEL CELL SOLID-STATE STORAGE

CROSS-REFERENCE TO RELATED APPLICATIONS

This application claims the benefit of U.S. Provisional Patent Application No. 61/160,258 entitled "Apparatus, System, and Method for Using Multi-Level Cell Solid-State Storage as Single-Level Cell Solid-State Storage," filed Mar. 13, 2009.

FIELD OF THE INVENTION

This invention relates to solid-state storage and more particularly relates to multi-level cell solid-state storage.

BACKGROUND

Description of the Related Art

To increase the capacity of storage in flash memory, multiple bits are stored in a single memory cell. While this increases the capacity, it also typically decreases the longevity of the device: the number of times it can be written; the number of times it can be read per write; and the ability of the data to be error free when the device is unpowered or operating at high temperature, etc.

The majority of the non-volatile memory market is driven in this direction by consumer products where capacity is key and the number of accesses is relatively low, as in a digital music player or a digital camera. Whereas this market segment drives production, there is a reasonable probability that the volumes will be highest and this may translate to lowest cost of parts. Said differently, a multi-level cell ("MLC") solid-state storage, such as flash memory, operating at half capacity may be less expensive on a cost per bit stored than single-level cell ("SLC") solid-state storage. While these price ratios are likely to vary over time, this allows a benefit from the disparity when the cost of the MLC is less than half of the SLC on a per bit basis.

In the solid-state storage ("SSS") space, the ability to use the lowest cost parts while achieving high performance (number and frequency of accesses) is advantageous.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

SUMMARY OF THE INVENTION

Figure 1:
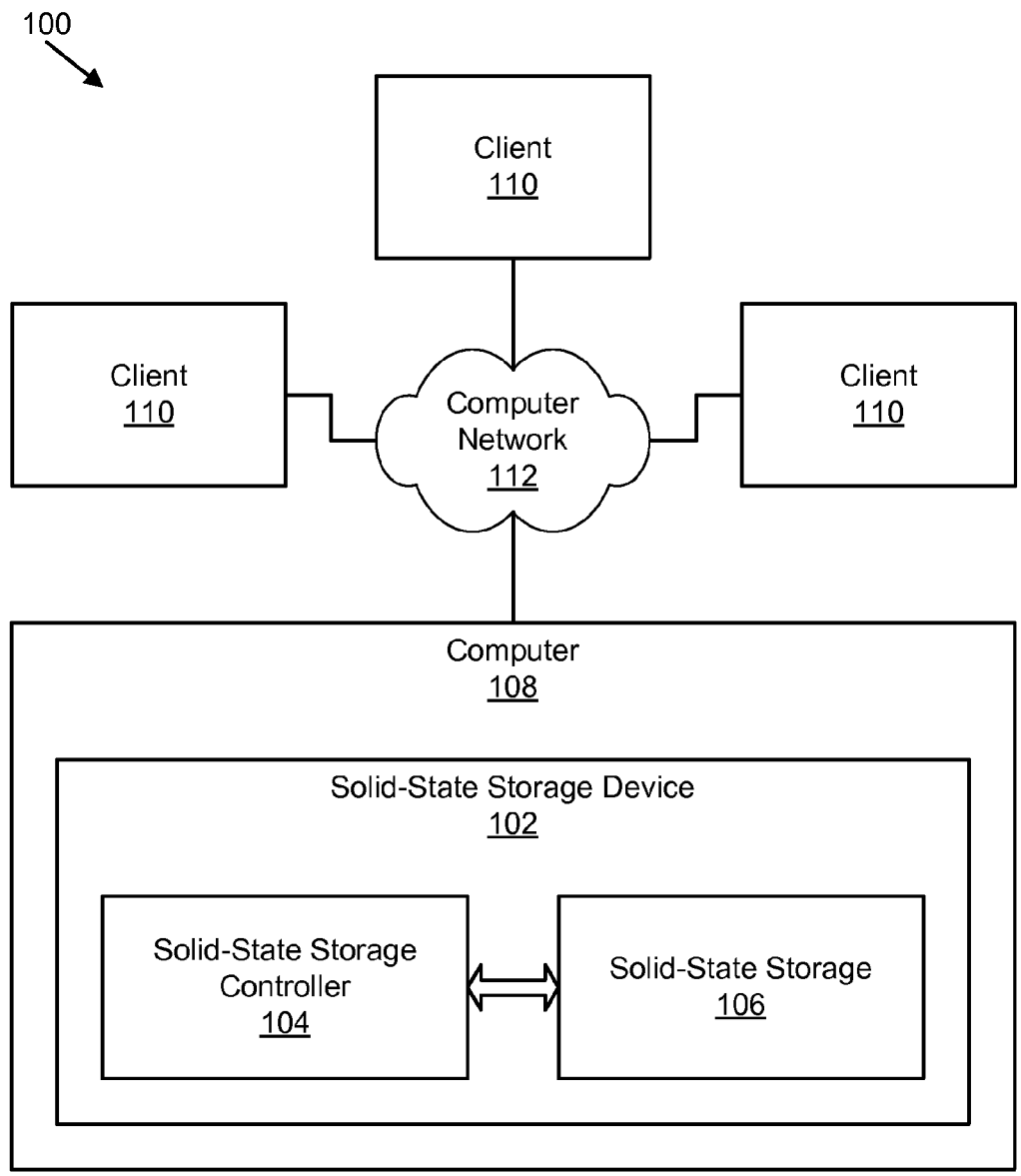
FIG. 1 is a schematic block diagram illustrating one embodiment of a system for using multi-level cell solid-state storage.

In one embodiment, the invention is a method to store information in a storage device comprising one or more multi-level memory cells. The method may include reading a data bit in a multi-level memory cell in a first read operation, and reading an audit bit in the multi-level memory cell in a second read operation that is separate from the first read operation. The method may further include determining that the audit bit fails to match an expected value for the audit bit, and determining that a validity of the data bit is suspect if the audit bit fails to match an expected value of the audit bit.

In certain embodiments, the second read operation of the audit bits is initiated in response to an audit-triggering event. An audit-triggering event may be: a read count reaching a read count limit; a program count reaching a program count limit; an error rate reaching an error rate limit; a number of detected data errors reaching an error limit; a number of operations reaching an operation limit; a timer reaching a time limit; free cycles on the storage device becoming available; or other occurrence.

In one embodiment, the audit-triggering event is a determination that a number of detected bit errors in an error correcting code ("ECC") chunk that includes the multi-level memory cell exceeds a correctable bit error count. The method may include flipping the data bit in the multi-level memory cell if the audit bit in the multi-level memory cell does not match the expected value of the audit bit, and thereafter rechecking the ECC chunk.

The method may include tracking the number of times that the audit bit fails to match the expected value of the audit bit and marking the multi-level memory cell as unreliable if the number of times the audit bit fails to match the expected value of the audit bit exceeds a limit. In addition, the storage device may use the multi-level memory cell as a single-level memory cell if the number of times the audit bit does not match an expected value of the audit bit exceeds the limit.

In certain embodiments, the address of the audit bit (the first address) in the multi-level memory cell is different from the address of the data bit (the second address) in the multi-level memory cell. In certain embodiments, the delay of programming the audit bit is at least five times greater than a delay of programming the data bit, and the method further comprises writing data exclusively to the data bit.

In certain embodiments, the storage device may be configured to read the data bit and the audit bit of the multi-level memory cell in a single operation in addition to having the capability to read them in separate read operations. In certain embodiments, the reads of the audit bit occur as part of a background process on the storage device.

The invention may also include an apparatus to store information in a storage device comprising one or more multi-level memory cells. The apparatus may include instructions to receive a write command from a client, the write command comprising a logical block address. The apparatus may map the logical block address received from the client to one or more page pairs of the storage device, wherein each page pair comprises a lower page associated with a least significant bit (LSB) of a plurality of multi-level cells in the storage device, and an upper page associated with a most significant bit (MSB) of the multi-level cells.

The apparatus may also set the physical address for storing data associated with the write command to the physical address for the lower pages of the one or more page pairs, and write data associated with the write command received from the client to only one of the pages in each page pair of the one or more page pairs. Data in the lower page may be validated using audit data from the upper page. In addition, the apparatus may store audit data for the power page in the upper page of the page pair.

In certain embodiments, the apparatus searches for bit errors in the data stored in a lower page in response to determining that a number of detected bit errors in an error correcting code ("ECC") chunk for the lower page exceeds a correctable bit error count. This may involve searching for bit errors in the data stored in the lower page further by searching the audit data in an upper page paired to the lower page and determining that the lower page comprises suspect data bits if corresponding bits in the upper page do not match an expected value for the audit bit. In response, the apparatus may flip one or more bits in the lower page corresponding to those bits in the upper page that do not match the expected value.

The apparatus may include hardware controllers that program the multi-level memory cells employing a two-phase programming model for paired pages. In such an embodiment, the apparatus may increase a guard band between two data states in the multi-level cells of the storage device by executing a first program phase to put the cell in an intermediate state, followed by a second program phase to put the cell in a final state.

In certain embodiments, setting a physical address for storing data associated with the write command further comprises setting the physical page for storing data to the upper page, in response to determining that reliability of storing data in the lower page has decreased below a threshold.

Also presented is a system for storing information in a storage device, the system comprising one or more multi-level memory cells. The system may include a driver, a mapping logic module, and a hardware controller. The driver may be configured to receive a write command from a client, the write command comprising a logical block address. The mapping logic module may be configured to map the logical block address received from the client to one or more page pairs of the storage device, wherein each page pair comprises a lower page associated with a least significant bit (LSB) of a plurality of multi-level cells in the storage device, and an upper page associated with a most significant bit (MSB) of the multi-level cells. The mapping module may also be configured to set a physical address for storing data associated with the write command to the physical address for the lower pages of the page pair. The hardware controller may write data associated with the write command received from the client to the physical address supplied by the mapping logic module.

In certain embodiments, the multi-level memory cells store n bits per storage cell by way of $2^n$ progressively increasing voltage states, and wherein n bits of the multi-level memory cells are organized into page tuples in which each bit of the multi-level memory cell is addressable in a distinct page of the page tuple. In certain embodiments, n equals 2 and the page tuple comprises a page pair in which the lowest page of the page pair corresponds to voltage states that are less than the maximum voltage state for the multi-level memory cells. The system may also be one in which the multi-level memory cells support four progressively increasing voltage states, and wherein the lower pages correspond to the first and third voltage states.

DETAILED DESCRIPTION

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Typically in a multi-level cell ("MLC") device, the number of electrons stored within a gate indicates a voltage differential that can be measured. The number of discrete levels that can be accurately determined is dependent upon the total number of electrons that can be stored, and the maximum variation in number of electrons that can be controlled. In today's MLC devices, there are typically four levels, representing two bits of information. The encoding of these levels to the bit values they represent may use a "Gray Code" or other encoding mechanisms.

In principal, this invention may apply to a variety of coding schemes, and methods to store the multiple values within a memory cell.

For simplicity in one embodiment, assume that the maximum voltage ("V0") is represented by a b'11' (two logic bits, each at a logic state of 1), the next to maximum voltage ("V1") represented by a b'10' (logic 1 and logic zero), then b'01' (logic 0 and logic 1), and then the lowest voltage ("V3") by b'00' (both logic 0). Within the device, in one embodiment there are three comparators used to differentiate the voltage levels: one for V0:V1, one for V1:V2, and one for V2:V3.

The two bits of an MLC, while sharing the same physical memory cell, may not be contiguous in an address space. Nevertheless, it would be unusual that these would be in separate erase blocks. An erase block is typically a block of storage that is erased in an erase operation. In many cases, the bits will be in different pages. The lower order addresses for the bits would frequently be the same. The possible variations here affect the operation of the device (the erasure, programming, and reading of the bits), but typically not the fundamental concept of the key invention.

One embodiment would be to write the data into one of the levels V0 or V3. In this case the data would be stored in the first of the two bits in an MLC. It would be further desired to read the data back using the comparator for the V1:V2 level. This would ideally require a special operational mode of the NAND Flash MLC memory array (the die). In this operational mode, there would typically only need to be a single program cycle to get the device from the V0 to the V3 state. Similarly, there would typically only need to be a single read to obtain the data.

The following are two of several possible cases that are indicative of how this might work (other combinations, such as switching "x" and "y" will be obvious to one skilled in the art):

Case 1:
Voltage: b'xy'
V0: b'10'
V1: b'11'
V2: b'01'
V3: b'00'
Case 2:
Voltage: b'xy'
V0: b'11'
V1: b'10'
V2: b'01'
V3: b'00'

Other programming models may also be used. Another example of a programming model is discussed in connection with FIG. 6. In case 1, it can be seen that only the upper order bit (x) need be read to determine if the data written to V0 or V3. In case 2, it can be also seen that only the upper order bit (x) need be read to determine if the data written to V0 or V3.

Case 1 may offer advantages over case 2. In case 1, a read of the lower order bit (y) allows an immediate determination that the quality of the data in the cell may be suspect. If it is a "0", it is unlikely that any read or program disturbs have affected the data value. Whereas the "y" values for an entire region of memory could be read simultaneously, these could be checked asynchronously to the reads of the "x" values. Therefore a background process could periodically audit the "y" values throughout the array, and depending on the quantity and frequency of "events" determine that a physical erase block should be garbage collected, or even retired. This background process could be initiated in response to one or more of a timer, access counter, read counter, detected error rate, reset, power on, or other event.

These events might cause the audit of a single page, erase block, region, or the entire array. These events may support overlapping audits. For example, a periodic audit of the entire memory space may be in process when a high number of bit errors is detected during a read, causing an immediate audit of a region associated with said read. Clearly, the results of these audits can be integrated into the selection scheme used to determine the next erase block, or set of erase blocks to be queued for garbage collection.

A more sophisticated scheme might set a threshold for audited failures that would then set a counter that limits the number of times the associated region can be accessed before it is garbage collected. One skilled in the art will see that a wide variety of event triggers may be determined and coordinated with the general operation of the device to improve the integrity of the data and/or the life expectancy of the solid-state storage ("SSS").

Information regarding the relationship between number of program-erase cycles, number of reads, error correction rates, and these audits can be logged and used as a basis of determining the long term life of the product, and project when the SSS should be replaced. These criteria may be adjusted through thresholds, rules, heuristics, history provided by the vendor, the user, or both. Clearly, for high data integrity, it is possible to read both "x" and "y" simultaneously to verify the quality of the stored data.

Some schemes may require an order to the writing of the "x" and "y" bits (two program cycles). Some schemes may require the simultaneous writing of "x" and "y" (a single program cycle; this does not mean that "x" and "y" are necessarily, logically adjacent by address). In one embodiment (related to the chip function related above), only one of the bits would be required to be written to the device. The other bit would be derived from this bit, and only one program cycle required. For example, in connection with FIG. 6 described in greater detail below, if the least significant bit is written to a 0, the 1 value of the most significant bit can be derived based on the value of the least significant bit, particularly in those models where the L3 state is not used. In certain embodiments, this assumption may hold true only if there is no error in the audit bit. This embodiment may improve the performance of the device by reducing the transfer time of the bit pair to the storage device.

Referencing case 1, after an erase cycle, the device is left in a V0 state (other combinations of starting condition do not alter the basic function of the invention), leaving the "x" in a logical 1 state and the "y" in a logical 0 state. It is desirable when programming the "x" to a logical 0, that the program cycle not put the device into V2 state. In one embodiment, this is accomplished by the storage device without intervention by the controller. Support of the audit function described above would mean that the write and the read process are not symmetric. The write would simultaneously write both the "xy" when provided with only the "x." But, on a read, only the "x" would be accessed during a data read, and only a "y" would be accessed during an audit (though, as mentioned above, both could be accessed simultaneously). In a related embodiment, the storage device could do an audit of the "y" bit each time the "x" bit is read, and report a result of the audit in conjunction with the data read. Similarly, the device could independently audit the "y" bits autonomously, or under the guidance of the controller.

Where the storage device does not have this capability, the controller would create the "y" based on the "x" data and write it to the storage array. While this would take additional time to transfer the data on a write, it improves the quality and audit-ability of the data in the cells. In one embodiment, the "xy" data would be programmed simultaneously.

In a related embodiment, the writing of the audit bits ("y" in this example) is postponed. There are many events that might be used to later initiate this process. In one embodiment, the audit bits would typically not be written until the entire device reaches a prescribed wear out condition. This wear out condition might be identified by one or more of a number of program-erase cycles, a number of read cycles, a number detected bit errors, or other tracked condition. In another embodiment, the bits would be written when data cooled off as part of a caching process, and garbage collected into a region of similar data. In another embodiment, the bits would be written in a background process. In another embodiment, the background process might be associated with a garbage collection process.

In another embodiment, information provided by the client might indicate expected permanence of the data and a need to consume or not consume additional bandwidth to write audit bits. In another embodiment, a client can control these various mechanisms globally (for an entire device, a partition of the device, or other logical or physical region within the device) or specific to transfer of a segment of data. In a related embodiment, a device might have a burst mode that rapidly accepts new data without the additional overhead and then catches up later. In another embodiment, audit data is added in conjunction with reads of the data. When the data is later accessed, a controller identifies that an audit data has not been added, and using the read data constructs the audit data and writes this to the device.

In one embodiment, solid-state storage is initially used as MLC solid-state storage where data is stored in each level of a cell. After a triggering event data in the solid-state storage is reconfigured such that the solid-state storage operates as SLC solid-state storage with at least one bit of each cell being used as an audit bit. In another embodiment, where each multi-level cell is capable of storing more than two bits, one or more bits are used to store data and at least one bit is used for audit data. The triggering event could be a high read or program count, a number of errors crossing a threshold, a block error correcting code detecting an uncorrectable error, and the like. One of skill in the art will recognize other triggering events.

FIG. 1 is a schematic block diagram illustrating one embodiment of a system 100 for using multi-level cell solid-state storage in accordance with the present invention. The system 100 includes a solid-state storage device 102 with a solid-state controller 104 and solid-state storage 106. In one embodiment, the solid-state storage device 102 is in a computer 108 connected to one or more clients 106 through a computer network 112. The components of the system 100 are described below.

The system 100 includes at least one solid-state storage device 102. In another embodiment, the system 100 includes two or more solid-state storage devices 102. Each solid-state storage device 102 may include non-volatile, solid-state storage 106, such as flash memory, nano random access memory ("nano RAM or NRAM"), magneto-resistive RAM ("MRAM"), dynamic RAM ("DRAM"), phase change RAM ("PRAM"), etc. The solid-state storage device 102 is described in more detail with respect to FIGS. 2 and 3. The solid-state storage device 102 is depicted in a computer 108 connected to a client 110 through a computer network 112. In one embodiment, the solid-state storage device 102 is internal to the computer 108 and is connected using a system bus, such as a peripheral component interconnect express ("PCI-e") bus, a Serial Advanced Technology Attachment ("serial ATA") bus, or the like. In another embodiment, the solid-state storage device 102 is external to the computer 108 and is connected, a universal serial bus ("USB") connection, an Institute of Electrical and Electronics Engineers ("IEEE") 1394 bus ("FireWire"), or the like. In other embodiments, the solid-state storage device 102 is connected to the computer 108 using a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The system 100 includes one or more computers 108 connected to the solid-state storage device 102. A computer 108 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 108 may be a client and the solid-state storage device 102 operates autonomously to service data requests sent from the computer 108. In this embodiment, the computer 108 and solid-state storage device 102 may be connected using a computer network, system bus, or other communication means suitable for connection between a computer 108 and an autonomous solid-state storage device 102.

In one embodiment, the system 100 includes one or more clients 110 connected to one or more computer 108 through one or more computer networks 112. A client 110 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 112 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 112 may also include a network from the IEEE 802 family of network technologies, such Ethernet, token ring, WiFi, WiMax, and the like.

The computer network 112 may include servers, switches, routers, cabling, radios, and other equipment used to facilitate networking computers 108 and clients 110. In one embodiment, the system 100 includes multiple computers 108 that communicate as peers over a computer network 112. In another embodiment, the system 100 includes multiple solid-state storage devices 102 that communicate as peers over a computer network 112. One of skill in the art will recognize other computer networks 112 comprising one or more computer networks 112 and related equipment with single or redundant connection between one or more clients 110 or other computer with one or more solid-state storage devices 102 or one or more solid-state storage devices 102 connected to one or more computers 108. In one embodiment, the system 100 includes two or more solid-state storage devices 102 connected through the computer network 118 to a client 112 without a computer 108.

Figure 2:
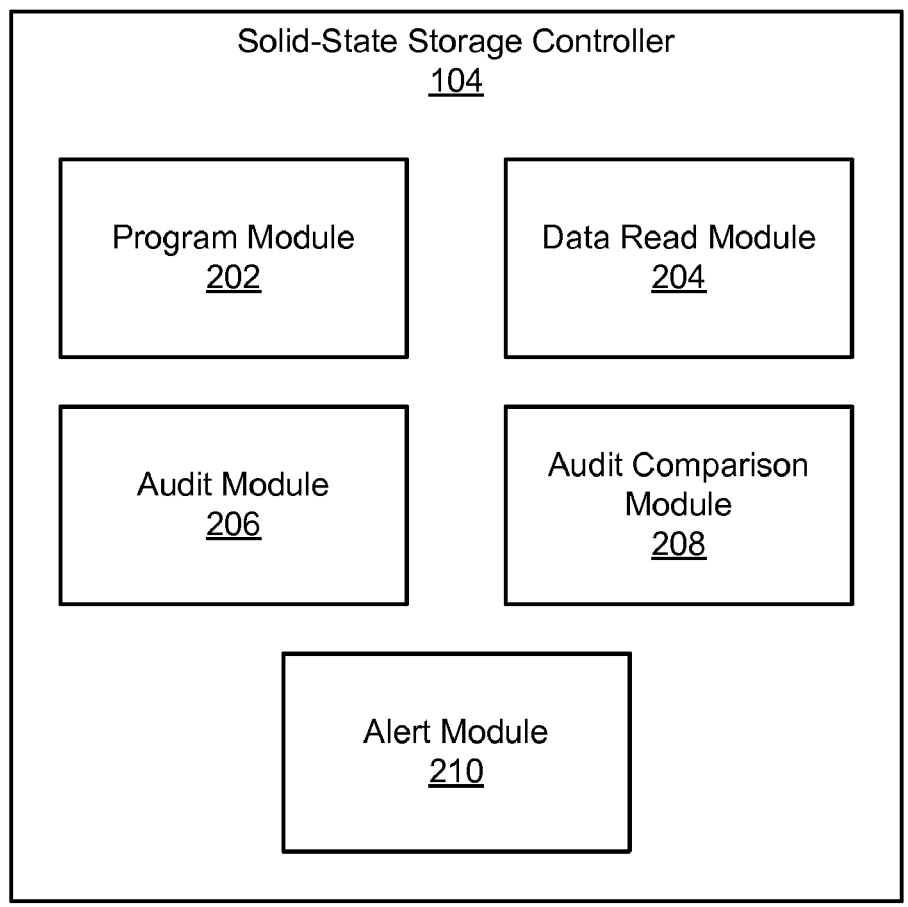
FIG. 2 is a schematic block diagram illustrating one embodiment of an apparatus for using multi-level cell solid-state storage.

FIG. 2 is a schematic block diagram illustrating one embodiment of an apparatus 200 for using multi-level cell solid-state storage in accordance with the present invention. In one embodiment, the apparatus 200 includes a program module 202, a data read module 204, an audit module 206, an audit comparison module 208, and an alert module, which are described below. The apparatus 200 may be in the solid-state controller 102, the solid-state storage device 106 or other location and the apparatus 200 is merely one embodiment of the invention described above.

The apparatus 200, in one embodiment, includes a program module 202 that programs one or more bits of a multi-level cell of the solid-state storage 106. In certain embodiments, the program module 202 writes the data bit exclusively and does not perform any write operations on the audit bit. In such an embodiment, the standard operation of the hardware controllers for the media comprising the multi-level memory cell may automatically set the audit bit to a known expected value. For example, an erase operation of an erase block for NAND flash comprising the multi-level cell may by design set the audit bit to a known expected value. For example, an erase operation of an erase block for NAND flash comprising the multi-level cell may by design set all bits including the audit bit to a logical binary 1 value.

In one embodiment, the program module 202 programs at least one audit bit with audit data and programs one or more data bits with data, where the audit data comprises a logic value and the data programmed into a data bit comprises a logic value. In one embodiment, the program module 202 programs the audit bit in the multi-level cell separately from programming the one or more data bits of the multi-level cell. In another embodiment, the program module 202 programs the audit bit and the one or more data bits of the multi-level cell in a single programming operation. In one embodiment, the apparatus 200 includes a data read module 204 that reads at least one data bit within the multi-level cell. In one embodiment, the apparatus 200 includes an audit module 206 that reads at least one audit bit of the multi-level cell to determine a logic value of the at least one audit bit. The audit module 206 reads the at least one audit bit in response to an audit triggering event. The audit triggering event comprises one or more of a read count reaching a read count limit, a program count reaching a program count limit, an error rate reaching an error rate limit, a number of detected data errors reaching an error limit, a number of detected errors in an error correcting code ("ECC") block exceeding a number of errors that are correctable using ECC, a number of operations reaching an operation limit, and a time of operation reaching a time limit. One of skill in the art will recognize other audit triggering events or combinations thereof.

In one embodiment, the apparatus 200 includes an audit comparison module 208 that compares the logic value of an audit bit read by the audit module 206 with a logic value programmed into the audit bit by the program module 202. In another embodiment, the apparatus 200 includes an alert module 210 that sends an alert in response to the audit comparison module 208 determining that the logic value read by the audit module 206 differs from the logic value programmed into the audit bit by the program module 202.

In one embodiment, the data read module 204 reads the one or more data bits and the audit module 206 reads the at least one audit bit in a single sequence of operations. In another embodiment, the data read module 204 reads the one or more data bits in a separate operation from the audit module 206 reading the at least one audit bit.

Figure 3:
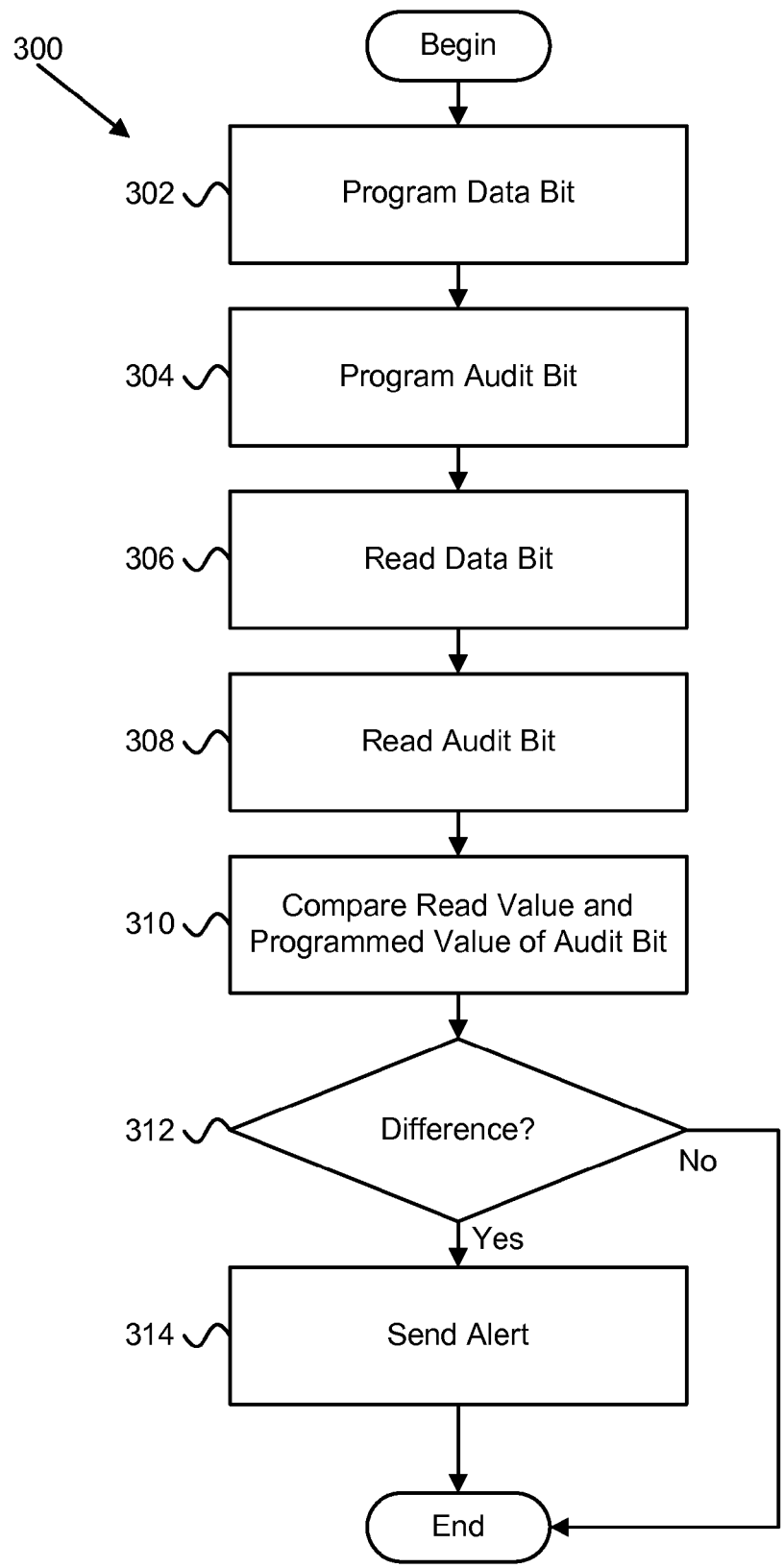
FIG. 3 is a schematic flow chart diagram illustrating one embodiment of a method for using multi-level cell solid-state storage.

FIG. 3 is a schematic flow chart diagram illustrating one embodiment of a method 300 for using multi-level cell solid-state storage in accordance with the present invention. The method 300 begins and the program module 202 programs 302 two or more bits of a multi-level cell of the solid-state storage device 102. The program module 202 programs 302 one or more data bits with data and programs 304 at least one audit bit with audit data. The audit data comprises a logic value and the data programmed into a data bit comprises a logic value.

The data read module 204 reads 306 at least one data bit within the multi-level cell. The audit module 206 reads 308 at least one audit bit of the multi-level cell to determine a logic value of the at least one audit bit. In one embodiment, the audit module 206 reads 308 the at least one audit bit in response to an audit triggering event. The audit comparison module 208 compares 310 the logic value of an audit bit read by the audit module 206 with a logic value programmed into the audit bit by the program module 202. The audit comparison module 208 may store an expected value for the audit bit (for example, the logic value that the audit module 206 should write or a logic value that is set in the audit bit by operation of the media for the multi-level cells) and use the expected value to determine whether the logic value of the audit bit differs from the logic value of the audit bit as written. If the audit comparison module 208 determines 312 that the logic value of an audit bit read by the audit module 206 differs from a logic value programmed into the audit bit by the program module 202, the alert module 210 sends 314 an alert, and the method 300 ends. If the audit comparison module 208 determines 312 that the logic value of an audit bit read by the audit module 206 does not differ from a logic value programmed into the audit bit by the program module 202, the method 300 ends.

While the specification and claims refers to a first read operation and a second read operation, this is intended only to show that the read operations are separate. It is not intended to show that the first read operation necessarily occurs before the second read operation, or that any requisite temporal relationship exists between the read operations. To the contrary, in certain instances, the second read operation may occur before the first read operation. In certain instances, the first read operation may occur before the second read operation.

Figure 4:
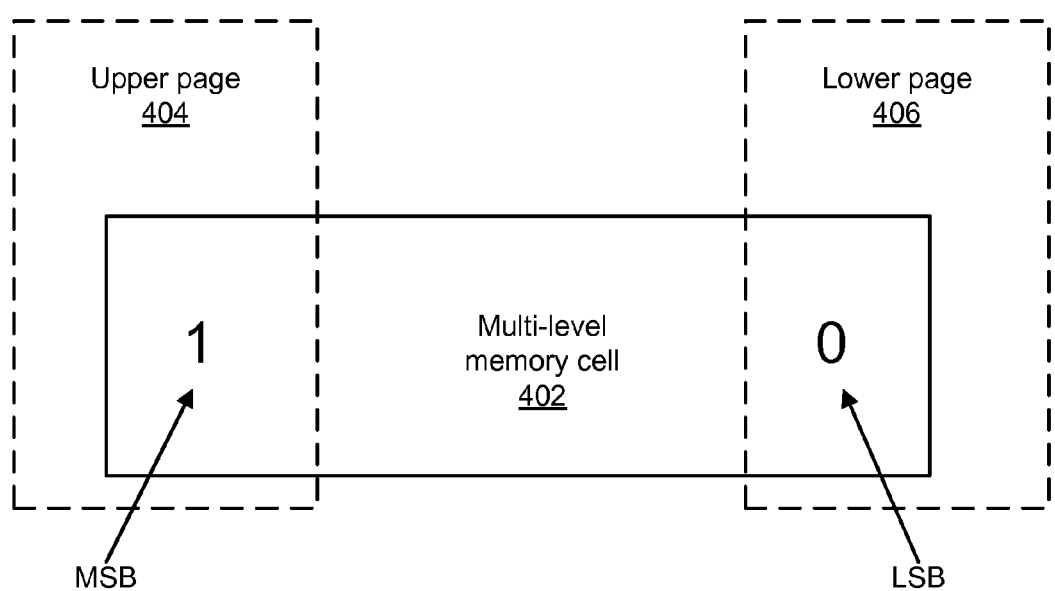
FIG. 4 is a schematic block diagram illustrating one embodiment of a multi-level memory cell.

FIG. 4 shows one representation of a multi-level memory cell 402 in a storage device. The multi-level memory cell 402 is a cell that has $2^n$ possible states, where n is equal to the number of bits per cell. For example, a multi-level memory cell such as the one shown in FIG. 4 may store 2 bits of information, and accordingly have four possible states, as discussed in greater detail below.

The multi-level memory cell 402 stores at least a most significant bit (MSB) and a least significant bit (LSB). In certain embodiments, as shown in FIG. 4, the MSB and the LSB, though part of the same physical multi-level memory cell 402, may be assigned to different pages of the media. In certain embodiments, a plurality of the multi-level memory cells 402 are organized on the solid-state storage media (such as NAND flash for example) as a page. In certain solid-state storage media comprising a plurality of the multi-level memory cells 402 a page is the smallest unit that can be written to the media. In such embodiments, the multi-level memory cell 402 may be associated with a page pair. A page pair is a pair of pages (upper and lower) that are associated with a single set of physical multi-level memory cells. For example, in FIG. 4, the multi-level memory cell 402 is associated with the page pair that includes the upper page 404 and the lower page 406. The upper page 404 is associated with the MSB, and the lower page 406 is associated with the LSB.

Thus, the MSB and LSB in the same multi-level memory cell 402 may have different addresses in the storage device. In certain embodiments, the upper page 404 includes the MSBs of a plurality of multi-level memory cells 402, and the lower page 406 includes the LSBs of the same multi-level memory cells 402. Writes directed to the upper page 404 may therefore cause changes only in the MSBs of the associated multi-level memory cells 402, while writes directed to the lower page 406 cause changes only in the LSBs of the associated multi-level memory cells 402. For multi-level memory cells such as NAND flash, writes directed to an upper page 404 or a lower page 406 may cause changes to only certain of the associated multi-level memory cells 402, since an erase operation puts the multi-level memory cells 402 in a first logic value state, and the write operation or program operation only change certain multi-level memory cells 402 to the opposite logic value state. Similarly, reads of data stored in the upper page 404 cause reads of the MSBs of multiple multi-level memory cells 402, and reads of data stored in the lower page 406 cause reads of the LSBs of multiple multi-level memory cells 402.

In certain embodiments, the multi-level memory cell 402 may store a data bit and an audit bit. The audit bit may be used as an indicator of the validity of the data bit with which the audit bit shares a multi-level memory cell, even though the bits are assigned different pages. A data bit is valid if it has retained the value written to it during a previous successful write operation. In one embodiment, the MSB serves as the audit bit and the LSB serves as the data bit. In certain embodiments, there may be additional bits stored in the multi-level memory cells. For example, certain multi-level memory cells may support three or more bits. In such embodiments, the bits that are not the MSB nor the LSB may be apportioned to act as data bits or audit bits depending on the needs of the storage system.

In certain embodiments, the data bits are read in response to requests for data that has been stored on the storage device. Such a request may be referenced as a first read operation. In certain embodiments, the first read operation is directed to the lower page 406 such that only the LSB is returned from the multi-level memory cell 402. For example, a client (such as a file system software application, operating system application, database management systems software application, a client computer, a client device, or the like) may store data on a storage device. In this example, when the client sends a write request, the data is written exclusively to the lower page 406. As a result, the LSBs in the various multi-level memory cells 402 are changed, but the MSBs are not changed by the write. Similarly, in this example, when the client reads data, the read is directed or addressed to the lower page 406 and only the LSBs associated with the lower page 406 are read.

Writing data exclusively to the lower page 406 may reduce the capacity of the solid state storage media, but increase the reliability of the storage device. For example, as described further below, writing exclusively to the lower page may place less stress on the individual multi-level memory cells and thereby reduce instances of failure in the storage device. In addition, the manufacturer and consumer may take advantage of the lower cost of MLC media while getting performance comparable to SLC media. Furthermore, in embodiments which use a mapping logic module described below to handle mapping the pages, the manufacturer can easily substitute between MLC and SLC media for the storage device without having to make major redesigns each time.

The audit bits may be read in response to requests for audit data that are requested by a second read operation that is separate from the first read operation. As noted above, in certain embodiments, the standard reads generated by a client are for data, as opposed to audit data. In certain embodiments, the audit data (and the associated pages) are hidden from the client such that these pages are transparent to the client. However, certain processes may generate reads of the audit data in read requests that are separate from the first read operation. Alternatively or in addition, certain processes, operations, or conditions of the storage device (described in more detail below) may trigger reads of the audit data in read requests that are separate from the first read operation.

In certain embodiments, the audit bits are read from the upper page 404 and compared to an expected value for the audit bit. The expected value for the audit bit represents the value that the audit bit should have if the data in the multi-level memory cell storing the audit bit has not changed from a value set in the audit bit prior to programming/writing the data bit. In certain solid-state storage the audit bit may change by a voltage state for the multi-level memory cell drifting above or below a voltage state that the multi-level memory cell was set to. For example, the expected value of an audit bit may be a binary 1 value. Thus, the audit bit for the multi-level memory cell 402 is read and compared with the expected value. If the audit bit fails to match the expected value for the audit bit, the storage device may determine that the validity of the data bit in the same multi-level memory cell 402 (the LSB in FIG. 4) is suspect. A data bit that matches the value that was written to the bit is valid, while a data bit that does not match the value that was written to the bit is invalid. That the validity of the data bit is suspect means that the data bit may still be valid, but that the multi-level memory cell 402 has changed states and therefore the associated data bit may have also flipped and therefore may be invalid. If there is a bit in error in the lower page 406, that an audit bit associated with that bit in the lower page 406 does not match its expected value provides a strong indicator that the data bit associated with the audit bit may be in error. As noted above, a data bit is valid if it has retained the value written to it during a successful write operation. A data bit is invalid if it has unexpectedly changed value due to a change in the multi-level memory cells 402's voltage state due to unexpected charge leakage, unexpected charge retention, or other phenomena known to unintentionally alter the voltage state of a multi-level memory cell.

As explained above, in certain embodiments, the audit bit is read as part of a second read operation that is separate from the first read operation. The second read operations may be triggered as part of an audit of the validity of the bits in the multi-level memory cell 402 (and other cells) in the storage device. The second read operation may be initiated in response to an audit-triggering event. An audit-triggering event is some event that causes the storage device to read audit bits in multi-level memory cells 402. An audit-triggering event may be a read count reaching a read limit. For example, after a certain predetermined number of read operations are executed on the multi-level memory cell 402, the storage device may check the audit bit of the multi-level memory cell 402 to check the integrity of the data bit. An audit-triggering event may similarly include a program count reaching a program count limit, an error rate reaching an error rate limit, a number of detected data errors reaching an error limit, and a number of operations reaching an operation limit. In certain embodiments, a timer may be used such that when the timer reaches a time limit, data in the multi-level memory cells 402 are subjected to an audit. In certain embodiments, the storage device may perform audits when there are free cycles on the storage device. For example, when the buses, gate arrays, processors, or the like on the storage device are operating at capacity, the storage device may use the extra capacity to perform audits. When the storage device is operating at its limit (and therefore there are no free cycles) audit operations may be delayed until the more critical operations complete.

In certain embodiments, the audit bit is never read unless there is an audit-triggering event. Such an embodiment may speed operation of the device and reduce the overhead associated with audit operations. In certain embodiments, writing data exclusively to the lower page 406 and not reading the audit bit unless there is an audit-triggering event results in lower cost MLC flash media performing at a level substantially the same as more expensive SLC flash media.

In certain embodiments, the storage device may be further configured to read the audit bit along with the data bit as part of a single read operation in addition to reading the audit bit and the data bit as part of separate read operations. For example, the solid-state storage media vendors may add a new command that allows for two or more bits in a multi-level memory cell to be read or written two in a single solid-state storage media read or write instruction, even when the bits of the multi-level memory cell are organized into different pages. Such an instruction may be configured to read both the audit bit and the data bit from the multi-level memory cell as part of the same read operation. Reading an audit bit as well as data bits may be advantageous when a high degree of assurance that the data in the multi-level memory cell is valid is desirable. Such an embodiment would allow the validity of the data to be checked as it is read using the audit bits. In such an embodiment, the audit bit and the data bit may be stored in the same page as opposed to being stored in different pages. In other embodiments, a read operation directed to a page containing the data bit may trigger a corresponding read of the page containing the associated data bit.

Figure 5:
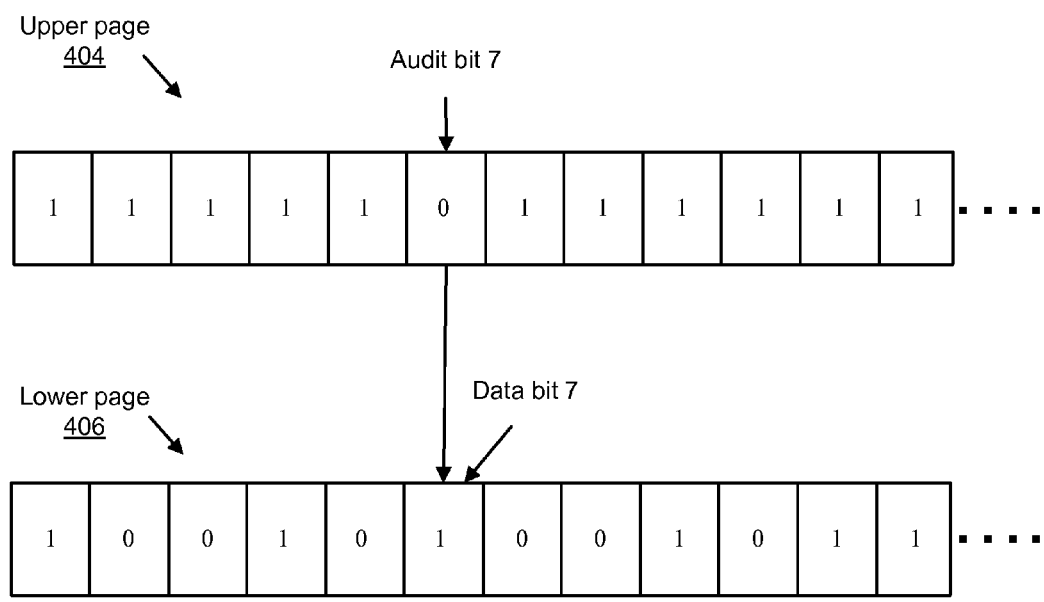
FIG. 5 is a schematic block diagram illustrating one embodiment of an upper page comprising audit data and a lower page comprising data.

FIG. 5 shows one example of how embodiments of the present invention may use an audit process in a storage device. FIG. 5 shows 12 bits of an upper page 404, and 12 corresponding bits of a lower page 406. The upper page 404 and lower page 406 will often be much larger than 12 bits, and embodiments of the invention are not limited to 12 bits. The upper page 404 and lower page 406 together comprise a page pair. Each multi-level cell of the media represents at least one bit in the upper page 404 and at least one corresponding bit in the lower page 406.

In certain embodiments, a storage device uses an error correction code (ECC) to provide increased data reliability of particular "chunks" of data on the storage device solid-state media. In such embodiments, the storage device may use the ECC to check the validity of data stored in the lower page 406. As explained above, the upper pages 404 may store the audit data. The audit bits may be set to the expected value without an explicit write command to the upper pages 404 as explained in greater detail below. In certain embodiments, the ECC validation algorithms can only detect a certain number of errors, and correct only a certain number of errors in the data in the lower page 406. Generally, ECC validation algorithms can detect more bit errors than they can correct. For example, an ECC chunk may be able to correct up to 11 bit errors in a chunk. If more than 11 bit errors are detected, a supplemental error correction process may be initiated. One such approach is described in U.S. patent application Ser. No. 12/467,914 entitled "Apparatus, System, and Method for Detecting and Replacing Failed Data Storage," filed by David Flynn, Jonathan Thatcher, Joshua Aune, Jeremy Fillingim, Bill Inskeep, John Strasser, and Kevin Vigor on May 18, 2009, which application is incorporated herein by reference.

In one embodiment, audit data of the upper page 404 is used to supplement the error correction process. In one embodiment, if the errors in the ECC chunk (for example, all of the lower page 406 in FIG. 5) exceeds the number of errors that can be corrected by the ECC algorithm, an audit-triggering event is initiated.

In response, the storage device may trigger reads of the audit bits in the upper page 404 to determine if any audit bits fail to match the expected value. For example, in FIG. 5, the expected value for the audit bits may be binary logic value one ("1"), and the storage device may determine that bit 7 of the upper page 404 fails to match the expected value of "1." As noted above, in certain embodiments, the audit bit 7 is stored in the same physical multi-level memory cell 402 as data bit 7 even though they belong to different pages. Consequently, changes in the value of the data bit due to voltage leakage, voltage increase due to read or write disturbs from neighboring memory cells, and the like that affect the data bit 7 of the multi-level memory cell 402 may also affect the audit bit 7. The storage device may make an assumption that the error in the lower page 406 is at the bit 7 position, since the audit bit in the upper page 404 associated with the bit 7 position is also in error. While such an assumption is not guaranteed to be correct, the identification of bit 7 as a suspect data bit provides initial information that can be used in supplemental error correction processes to minimize supplemental error correction overhead. Furthermore, information identifying a single bit as having a very high likelihood of being in error may also be combined with information about physically neighboring multi-level memory cells that may also indicate suspect data bit values.

A variety of supplemental error correction processes may be used, including parity substitution, changing the suspect data bit to its opposite binary value, and the like. For example, the patent application filed by Flynn et al. referenced above teaches an approach that involves reading data from an array of memory devices along with parity information for the data. An ECC module determines if errors exist and are correctable using the ECC. An isolation module replaces data read from a bad memory device with data generated from the parity data to replace the bad data. In certain embodiments, the storage device may respond to identifying a suspect data bit by flipping the data bit in the multi-level memory cell 402 if the associated audit bit does not match the expected value, and thereafter rechecking the ECC chunk. To continue the example in FIG. 5, the storage device may flip the value of bit 7 in the lower page 406 from a 1 to a 0, and then check the lower page 406 again using the ECC algorithm to determine whether the number of bit errors in the lower page 406 has been reduced to a correctable number.

Figure 6:
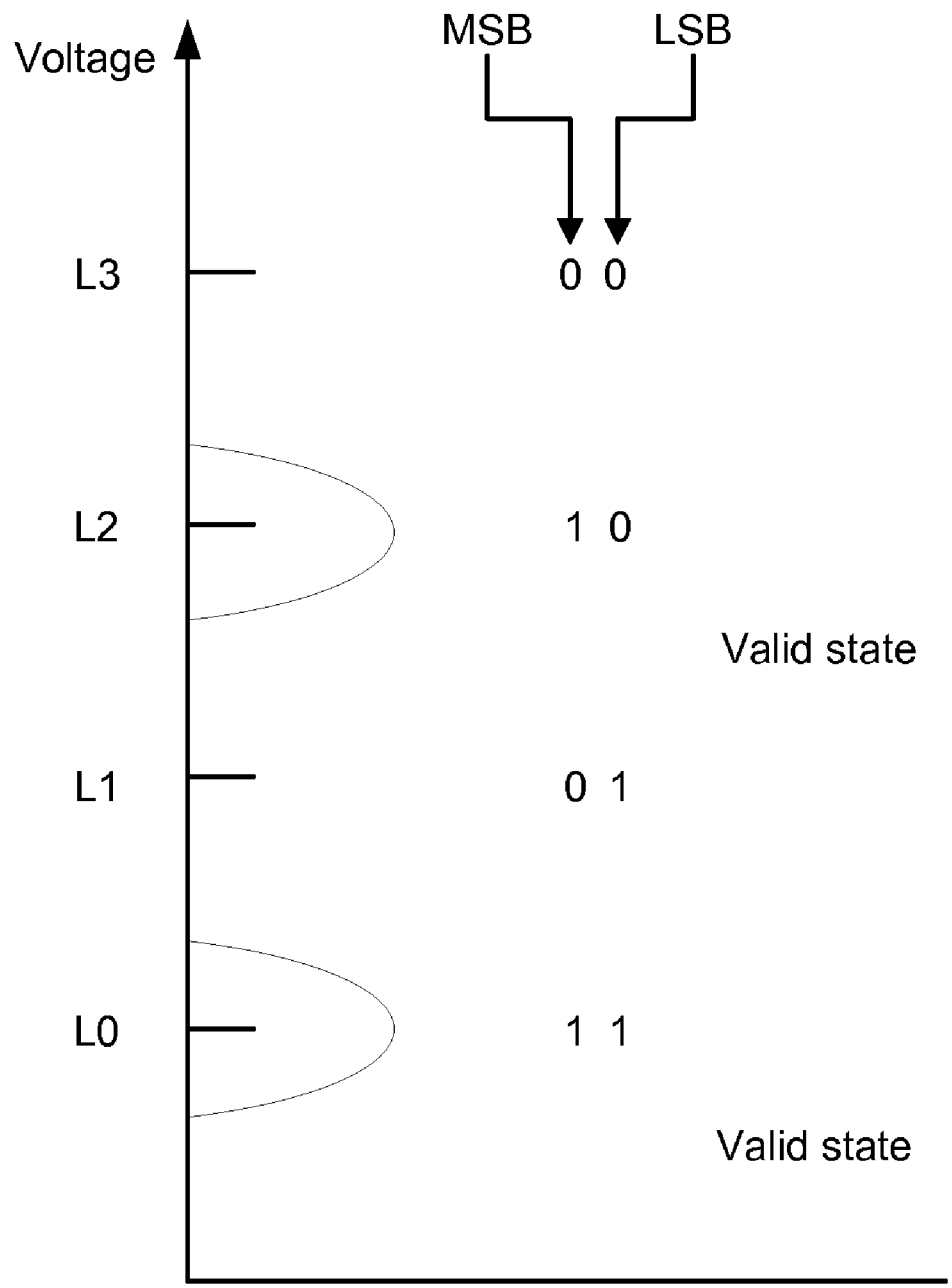
FIG. 6 is a schematic block diagram illustrating one embodiment of voltage levels in a multi-level memory cell and an associated programming model.

FIG. 6 shows one embodiment of a programming model for a multi-level memory cell such as the multi-level memory cell 402. Certain aspects of the foregoing discussion may be applicable only to those multi-level memory cells 402 having the represented programming model. Other aspects are generally applicable. Any limitations inherent in the represented programming model do not necessarily apply to all other programming models, and the present invention should not be construed as inherently containing any such limitations.

FIG. 6 shows that the value "11" is associated with the lowest voltage state (labeled L0), the value "00" is associated with the highest voltage state (labeled L3), and "10" and "01" are associated with intermediate states L2 and L1 respectively. The storage device interprets the four discrete levels of voltage stored in the multi-level memory cell 402 as representing two binary bits, a most significant bit and a least significant bit. As explained above, other programming models may be used. Also, certain storage devices may have more than four possible states, allowing more than two binary values to be stored in a single multi-level memory cell 402. The voltage levels L0, L1, L2, and L3 may or may not be contiguous; for example, in certain embodiments, the voltage levels are separated by band gaps known as guard band. For example, L0 and L1 may be separated by 0.3V. In certain embodiments discussed below, unused levels may be used to increase the guard band as shown in FIG. 6.

In one embodiment, the LSB corresponds to the lower page 406 and the MSB corresponds to the upper page 404. In certain embodiments, data sent to the storage device to be stored thereon is only stored in the LSB, and the MSB is used as an audit bit to ensure the integrity of the data stored in the MSB. In certain embodiments, the expected value for the audit bit is a "1." In such an embodiment, the valid states for the multi-level memory cell 402 are at L0 (when the data bit should store a 1) and L2 (when the data bit should store a 0). In certain embodiments, the expected value for the audit bit is selected to be the binary value that the audit bit will be given after the multi-level memory cell 402 has been erased and is ready for programming. For example, all bits in the multi-level memory cell 402 may be set to binary 1 after they are erased. In such embodiments, the audit bit is therefore expected to be a 1, and writes to the data bit are executed such that the audit bit value does not change from 1. To again reference FIG. 6, L0 and L2 correspond to such states.

For example, in FIG. 6, the multi-level memory cell 402 may be placed in L0 after an erase operation. L0 is thus the valid state when the data bit contains a 1. If the data bit is changed to a 0, the program operation changes the state from L0 to L2, which changes the value of the data (assuming the LSB is the data bit) but does not change the value of the audit bit (assuming the MSB is the audit bit). In certain embodiments, discussed below, the multi-level memory cell 402 may adhere to a two-phase programming model, which requires that the LSB be written to before the MSB can be written. In such a two-phase programming model, choosing to write data only to the LSB as in embodiments of the present invention means that the individual multi-level memory cells 402 could not move into state L1. Even if both the LSB and MSB pages are written to in the sequence consistent with the two-phase programming model the states would progress from L0 to L2 to L3 and then back to L0 when the erase block for these pages is erased.

In certain embodiments, as shown in FIG. 6, certain states are not used to store data; rather, they are unused and thereby provide additional guard band to enhance data retention. For example, in FIG. 6, L0 is a valid state and L2 is a valid state. As discussed above, the valid states for the device may be L0 and L1. Many solid-state storage devices cannot thereafter intentionally go from L2 to L1 directly. In order to go from L2 to L1, the multi-level memory cell 402 (and other multi-level memory cells 402 in the same erase block) would be erased and returned to L0, at which point the multi-level memory cell 402 could transition from L0 to L1. By transitioning from L0 to L2, state L1 can be considered additional guard band. This may be in addition to guard band already built into the storage device; for example, there may be a 0.3V separation between L1 and L0 which acts as a guard band between those two states.

In certain embodiments, the valid states are selected such that all valid states are less than the highest supported state in the multi-level memory cell 402. Such a configuration may be useful in extending the life of the storage device by reducing the stress placed on the individual multi-level memory cells 402 that occurs when the cells are pushed to the maximum supported voltage level. Such an embodiment may further reduce the risk of overshooting the maximum supported voltage level and damaging the multi-level memory cell 402.

The guard bands represent a difference in voltage levels that protect the data bit from drift caused by leakage or disturbances described above. A larger guard band may facilitate better data retention by allowing more drift without altering the binary state of the data bit stored in the cell. In the example shown in FIG. 6, if the multi-level memory cell has been programmed to the L0 level, and the voltage in the multi-level memory cell 402 unintentionally drifts up into the L1 level, the data bit (represented in the LSB) will not register as an error, or as invalid (since it remains at a 1). Thus, reads of the lower page 406 will not return an error at the bit associated with this particular multi-level memory cell 402.

However, the audit bit for L1 has changed from a 1 to a 0 and does not meet the expected value of 1. Thus, audits that check the validity of the audit bit will detect the error in the audit bit. In certain embodiments, the storage device may tally the number of times that an audit bit fails to match its expected value. After a certain number of times, the storage device may deem the particular multi-level memory cell 402 to be unreliable for continued use. The number of times the audit bit fails to match the expected value may be an element of a reliability algorithm to determine the reliability of the multi-level memory cell 402 that takes into account numerous other factors. In certain embodiments, reliability is determined on a larger scale, such as on an erase block scale. Thus, the failure of a particular multi-level memory cell 402 to have an audit bit that matches its expected value may contribute to metrics determining the reliability of the erase block to which the multi-level memory cell 402 belongs. The failure may further contribute to metrics determining the reliability of the storage device as a whole.

If the multi-level memory cell 402 is deemed unreliable, multi-level memory cell 402 may be marked as such. Alternatively, the storage device may take the multi-level memory cell 402 out of service by adjusting an address mapping to make the multi-level memory cell 402 un-addressable. In response to determining that the multi-level memory cell is unreliable, the storage device may retire the multi-level memory cell 402, configure the multi-level memory cell 402 to store only a single bit, or take other action that may be appropriate. Such action may occur on a larger scale than a single multi-level memory cell 402; for example, retirement and reconfiguration or remapping may occur at the erase block level, or the like.

If the state of the multi-level memory cell 402 is set to L2, and the voltage drifts down to the L1 level, both the LSB and the MSB will have changed values. Thus, in certain embodiments, the storage device may detect the error in the LSB during a read of the data of the lower page 406 (for example due to an ECC validation check), and may detect the error in the MSB during an audit. If the voltage drifts up from L2 to L3, the drift may be detected during an audit, but the data in the LSB (which remains a 0) remains unchanged and valid.

As noted above, if a drift occurs which causes a change in the data bit, the error is detected using ECC algorithm as part of a read process for the data. However, the storage device may not be able to detect which particular bits are in error. For example, when the number of errors exceeds 11 bits in a code word, the ECC may not be powerful enough to identify the bit error locations. Since the upper page 404 holds the expected value in each bit, the upper page 404 can serve as a mask or indicator of potentially invalid bits of the lower page 406. For example, by scanning for 0 values in the upper page 404, the storage device may determine which bits are likely in error. Even if the audit bits do not indicate with complete certainty which data bits are in error, by indicating which data bits are likely in error, the storage device can go through an iterative process of flipping suspect data bits and checking to see if the flips correct the problem.

In certain embodiments using the ECC approach described in the Flynn application referenced above, the isolation module may use the audit bits to determine which data bits are of suspect validity. In certain embodiments, this information may be provided to the isolation module. In response, the isolation module may start the correction and replacement process at the suspect data bits as opposed to iteratively moving through the entire die. Such an approach may significantly improve the speed with which the isolation module corrects the data.

In certain embodiments, the storage device may reconfigure a multi-level memory cell 402 to store only a single bit when the multi-level memory cell 402 loses its ability to accurately store and differentiate between all of the levels that the multi-level memory cell 402 was originally designed to support. For example, the storage device may be configured to use the multi-level memory cells to store only a single bit (as described below) once the number of times the audit bit does not match the expected value exceeds a threshold amount. In one embodiment, the storage device may configure the device to store a 1 at level L0, and a 0 at L3. In such a configuration, the storage device may interpret data stored at either L3 or L2 as a 0, and data stored at either L0 or L1 to be a 1. In this manner, the life of the storage device may be extended. In addition, this may improve data retention due to an increase in the guard band between the two valid states. In certain embodiments of such a configuration, only one of the two bits is given any value. For example, in FIG. 6, only the LSB may be read or written. The MSB (and the associated pages) may be retired and unused.

In certain embodiments, the LSB and MSB are programmed separately by the storage device. Such an approach may be taken due to vendor requirements for page pairing (i.e., a LSB bit of MLC cell is paired with an MSB bit of a different MLC cell) and page addressing (i.e., LSB page must be programmed before the MSB page). In certain instances, the LSB must be written before the MSB is written. In such embodiments, the delay associated with writing an audit bit to the MSB is at least five times greater than the delay associated with writing data to the LSB. In such instances, embodiments of the present invention write data exclusively to the LSB. Such embodiments may write no data to the audit bit in the MSB. Instead, such embodiments may rely on the fact that the media hardware controller sets the expected value automatically as part of the preparation of the media for data storage (i.e. certain solid-state storage devices such as NAND flash must be erased before they can be programmed).

In certain embodiments, the storage device may employ a two-phase programming model. In such a model, a logical value is first written to the LSB by way of a first write command to the lower page 406. The write command causes the multi-level memory cell 402 to move from its initial state (for example, 11) to the state which changes the value of the LSB without changing the value of the MSB. For example, writing a "0" to the lower page 406 causes the multi-level memory cell 402 to change from the L0 state (where both the LSB and the MSB are 1) to the L2 state (where the LSB is changed to a 0, but the MSB remains a 1). A subsequent write of a "0" to the upper page 404 is needed to move the multi-level memory cell 402 from the L2 state to the L3 state. Thus, in such an embodiment, two writes (one to the lower page 406 and one to the upper page 404) are needed to move the multi-level cell from L0 to L3. In addition, certain solid-state media vendors may impose a requirement that the lower page 406 must be written to before the upper page 404.

In such an embodiment, the storage device may increase the guard band between two states in the multi-level memory cell 402 by executing a first program phase to put the multi-level cell into an intermediate state, followed by a second program phase to put the cell into a final state. For example, as noted above, to increase the guard band, the storage device may be configured to act as a single-level memory cell with a 1 stored at L0 and a 0 stored at L3. In such an embodiment, either the MSB or LSB may be used as the data bit depending on the programming model. However, the cell will store only a single bit of information. For example, in FIG. 6, the LSB may be the best candidate for the data bit since the voltage can drift from L3 to L2 without a change in the LSB value, and the voltage can drift up from L0 to L1 without a change in the LSB value. In such embodiments, the MSB, while theoretically still addressable and retrievable, may be deemed to unreliable to be used for any purpose and simply left unused.

The storage device may receive a write that requires that a 0 be written to the multi-level memory cell 402, requiring that the multi-level memory cell change from a L0 to L3. The storage device may receive the write request, which may be directed to the lower page 406, and cause two write requests to execute: a first write request directed to the lower page 406 which moves the multi-level memory cell from L0 to L2 (L2 acts as the intermediate state in this example); and a second write request directed to the upper page 404 which changes the multi-level memory cell from the L2 intermediate state to L3, the final state. These operations may be hidden from a client requesting the write operation, and thus the process and associated complexity is handled transparently in one such embodiment.

In certain embodiments, the states for the lower pages 406 are selected such that a write to the lower page 406 sets both the data bit and the expected value of the audit bit (in the upper page 404) without requiring a separate write to the upper page 404. For example, in FIG. 6, the two valid states are selected such that the value of the audit bit is always 1, unless there is undesired drift between states. As a result, the audit bit may be set to match the expected audit bit value without requiring a separate write to the upper page 404 containing the audit bit.

In certain embodiments, it may be desirable to store data in the MSB and audit data in the LSB. In certain embodiments, the delay experienced in storing data in the MSB may be greater, but the multi-level memory cell 402 may exhibit less tendency to have values in the MSB inadvertently shift. In addition, storing the data in the MSB may cause less wear on the multi-level memory cell 402 for a programming operation. For example, in FIG. 6, using the MSB to store data may involve only L0 and L1 as valid states. Since L1 is a lower voltage, the multi-level memory cell 402 may experience less wear and/or damage as it is used. When the ability of the storage device to reliably store data in the lower pages 406 is compromised, the storage device may dynamically reconfigure write and read requests to store data in the MSB (and associated upper pages 404) and rely on the inherent expected value in the audit data of the LSB (and associated lower pages 406) to accommodate identification and correction of any future data bit errors.

Figure 7:
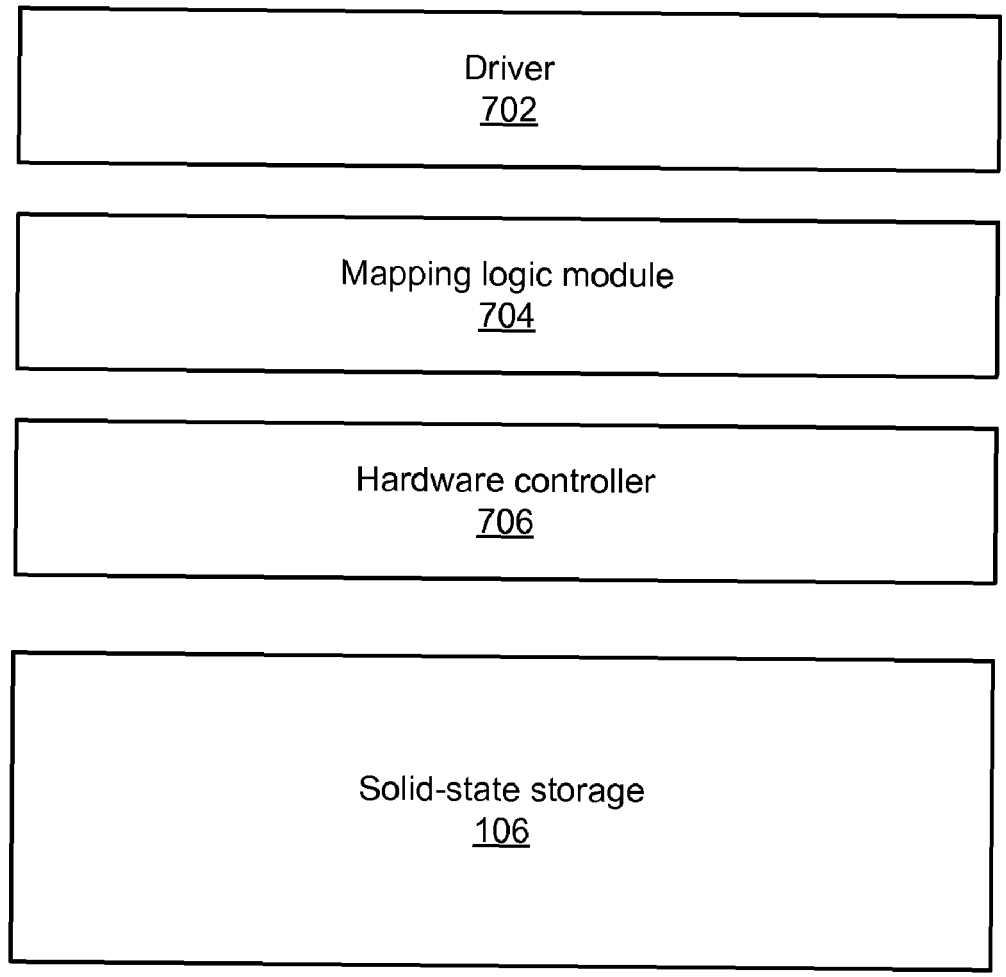
FIG. 7 is a schematic block diagram illustrating one embodiment of a system for storing data in a multi-level memory cell.

FIG. 7 shows one embodiment of a system for storing information in a storage device that includes one or more multi-level memory cells 402. In one embodiment, the system includes a driver 702, mapping logic module 704, hardware controller 706, and solid-state storage 106. In certain embodiments, these components are part of the storage device.

In one embodiment, the driver 702 receives write requests and read requests from one or more clients directed at the solid-state storage 106. The requests typically include an address component, such as a page address. In certain embodiments, neither the upper pages 404, nor the lower pages 406 are exposed to the client. Instead, the driver 702 presents a set of logically contiguous block addresses, cluster identifiers, file identifiers, or object identifiers (referred to herein as logical block addresses) to the client. The capacity presented to the client is half of the actual physical storage capacity of the storage device. The driver 702 may convert the logical block address to one or more physical media page addresses. The driver 702 receives client requests, and passes the request and one or more physical media page addresses to the mapping logic 704.

The mapping logic module 704 may be software, hardware, or a combination thereof. In one embodiment, the physical media page addresses are contiguous and the mapping logic maps the physical media page addresses to an appropriate lower page 406 or upper page 404 based on the current operation mode of the storage device and the wear condition of the multi-level memory cells of the storage device. In another embodiment, the driver 702 maps the logical block address directly to the appropriate address for the physical lower page 406.

The mapping logic module 704 may be software, hardware, or a combination thereof. In one embodiment, the mapping logic maps the physical page address to a page pair of the storage device. As explained above, the page pair may include a lower page 406 that is associated with the LSBs of the multi-level memory cells 402 in the solid state storage 106, and an upper page 404 that is associated with the MSBs of the multi-level memory cells 402. The mapping logic module 704 further sets the physical address for storing data associated with the write command received from the client to the lower pages 406 of the page pairs affected by the write command. The upper pages 404 for each lower page 406 may remain unchanged. Consequently, because the solid-state media must be erased prior to being programmed or written to the upper pages 404 for each corresponding lower page 406 in use may in turn be used for audit data (i.e., holding the expected value).

For example, in one embodiment, the driver 702 may receive a request that data be written to LBAs one through three on the storage device. The driver 702 converts the LBA identifiers to contiguous pages one through three. The mapping logic module 704 may receive that converted request and determine that page one is a lower page 406 that can store data, that page two is actually an upper page 404 that stores audit data and is not used for writing data, and that page three is a lower page 404 that can store data. In response, due to page pairing, the mapping logic module 704 may remap the write request such that the data is written to lower pages one, three, and five. Upper pages two, four, and six may hold audit data for pages one, three, and five. For example, pages one and two may be a page pair, pages three and four a page pair, and pages five and six a page pair.

In this embodiment, the write requests are mapped appropriately to ensure that data is written only to the lower pages 406, and the mapping is hidden from the client and, in certain embodiments, from the driver 702 as well. Appropriate updates are made to indexes to ensure that reads and other requests for the data from clients are routed to the correct physical addresses and/or offsets where that data is stored.

The hardware controller 706 receives the remapped write and/or read requests from the mapping logic module 704 and executes them such that the data is stored on the solid-state storage 106 as directed by the instructions given by the mapping logic module 704. The hardware controller 706 may be hardware, firmware, software, or a combination thereof. In certain embodiments, the hardware controller 706 may comprise a field programmable gate array (FPGA), a processor, or an application specific integrated circuit (ASIC).

Figure 8:
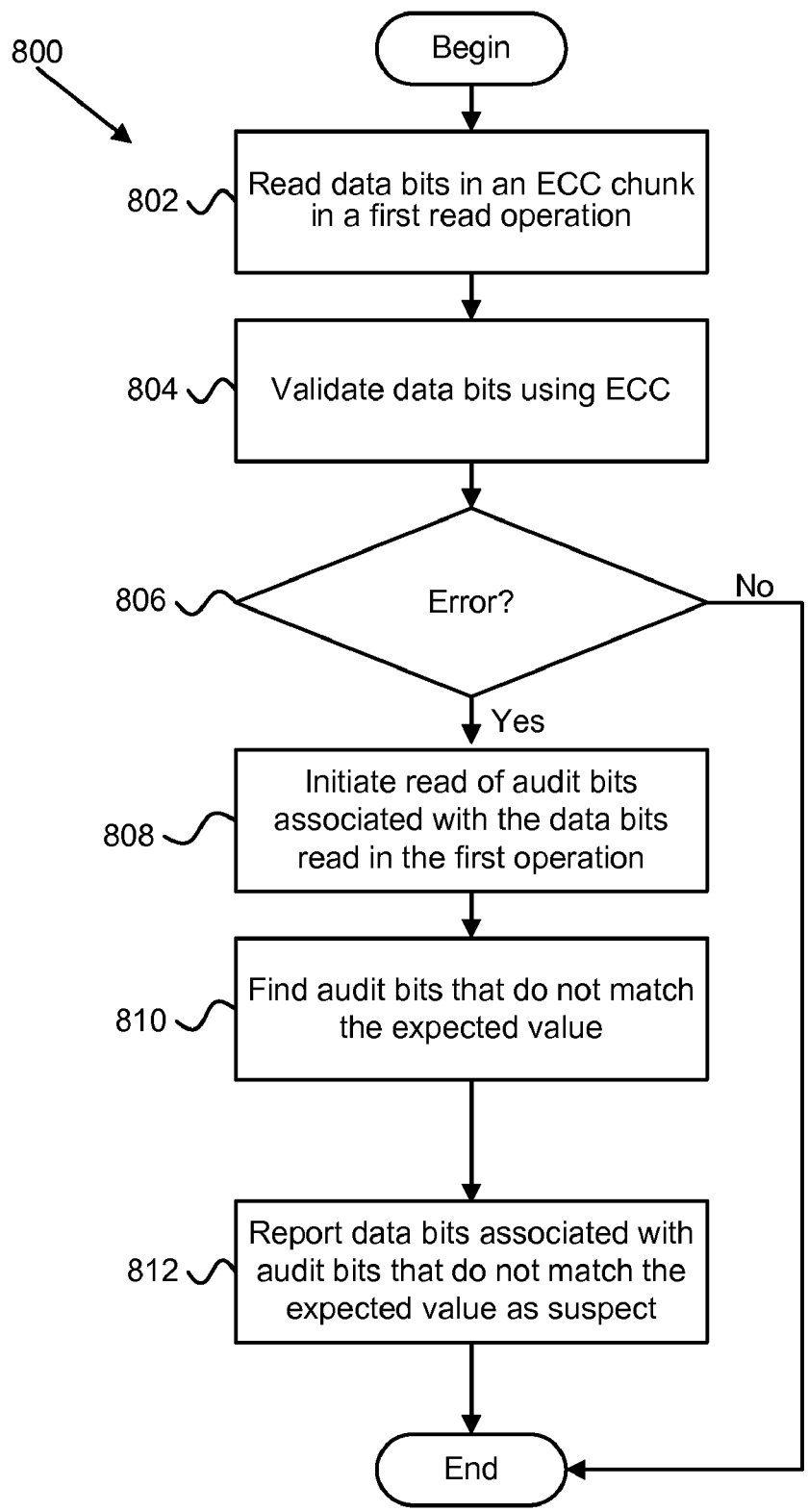
FIG. 8 is a schematic flow chart diagram illustrating one embodiment of a method for using audit data to perform error checking.

FIG. 8 shows one embodiment of a method for using audit bits in upper pages 404 to facilitate correcting errors in the data bits in lower pages 406. The method steps do not need to occur in the order shown. The method 800 begins with reading 802 data bits in an ECC chunk in a first read operation. As described above, the ECC chunk may be stored in the lower pages of page pairs in the storage device. The method may also include validating 804 the data bits using the ECC. If there is no error detected 806, or if the number of errors can be corrected using the ECC, the method 300 ends and the data is returned to the requesting entity.

If there is an error that cannot be corrected using the ECC, the method includes initiating 808 a second read of audit bits that are associated with the data bits that were read in the first read operation. In one embodiment, these audit bits are those that are stored in the upper pages 404 of the page pair. Because the audit bits of the upper pages 404 share the same physical multi-level memory cell as the lower pages, changes to the data bits in the lower pages are also reflected in the audit bits of the upper pages 404. The method then finds 310 those audit bits that do not match the expected values for the audit bits, and reporting 812 the data bits that are associated with audit bits that do not match the expected value as having suspect validity.

In response, the method 800 may further include flipping the data bits that have suspect validity and rechecking the data bits using the ECC chunk. The method 800 may also include indicating that the reliability of one or more of the multi-level memory cells 402 that make up the ECC chunk is suspect.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method to store information in a storage device comprising one or more multi-level memory cells, the method comprising:
    reading a data bit in a multi-level memory cell in a first read operation;
    reading an audit bit in the multi-level memory cell in a second read operation separate from the first read operation;
    determining that the audit bit fails to match an expected value for the audit bit; and
    determining that a validity of the data bit is suspect in response to the audit bit failing to match an expected value of the audit bit.

2. The method of claim 1, further comprising initiating the second read operation in response to an audit-triggering event.

3. The method of claim 2, wherein the audit-triggering event comprises one or more of: a read count reaching a read count limit; a program count reaching a program count limit; an error rate reaching an error rate limit; a number of detected data errors reaching an error limit; a number of operations reaching an operation limit; a timer reaching a time limit; and free cycles on the storage device becoming available.

4. The method of claim 2, wherein the audit-triggering event comprises a determination that a number of detected bit errors in an error correcting code ("ECC") chunk that includes the multi-level memory cell exceeds a correctable bit error count.

5. The method of claim 4, further comprising flipping the data bit in the multi-level memory cell in response to determining that the audit bit in the multi-level memory cell does not match the expected value of the audit bit and thereafter rechecking the ECC chunk.

6. The method of claim 1, further comprising tracking a number of times that the audit bit fails to match the expected value of the audit bit.

7. The method of claim 6, further comprising marking the multi-level cell as unreliable in response to the number of times the audit bit fails to match the expected value of the audit bit exceeding a limit.

8. The method of claim 7, further comprising configuring the storage device to use the multi-level memory cell as a single-level memory cell in response to the number of times the audit bit does not match an expected value of the audit bit exceeding the limit.

9. The method of claim 1, wherein a first address of the audit bit in the multi-level memory cell is different from a second address of the data bit in the multi-level memory cell.

10. The method of claim 9, wherein a delay of programming the audit bit is at least five times greater than a delay of programming the data bit, the method further comprising writing data exclusively to the data bit.

11. The method of claim 1, further comprising reading the data bit and the audit bit of the multi-level cell in a single operation.

12. The method of claim 1, wherein reading the audit bit in the second read operation occurs as part of a background process of the storage device.

13. An apparatus to store information in a storage device comprising one or more multi-level memory cells, the apparatus comprising instructions to execute the following:
    receiving a write command from a client, the write command comprising a logical block address;
    mapping the logical block address received from the client to one or more page pairs of the storage device, wherein each page pair comprises a lower page associated with a least significant bit (LSB) of a plurality of multi-level cells in the storage device, and an upper page associated with a most significant bit (MSB) of the multi-level cells;
    setting a physical address for storing data associated with the write command to the physical address for the lower pages of the one or more page pairs; and
    writing data associated with the write command received from the client to only one of the pages in each page pair of the one or more page pairs.

14. The apparatus of claim 13, further comprising validating data in the lower page using audit data from the upper page.

15. The apparatus of claim 14, further comprising searching for bit errors in the data stored in a lower page in response to determining that a number of detected bit errors in an error correcting code ("ECC") chunk for the lower page exceeds a correctable bit error count.

16. The apparatus of claim 15, wherein searching for bit errors in the data stored in the lower page further comprises searching the audit data in an upper page paired to the lower page and determining that the lower page comprises suspect data bits in response to corresponding bits in the upper page not matching an expected value.

17. The apparatus of claim 13, further comprising storing audit data for the lower page in the upper page of the page pair.

18. The apparatus of claim 13, further comprising flipping one or more bits in the lower page corresponding to bits in the upper page that do not match the expected value.

19. The apparatus of claim 13, wherein one or more hardware controllers that program the multi-level memory cells employ a two-phase programming model for paired pages.

20. The apparatus of claim 19, further comprising increasing a guard band between two data states in the multi-level cells of the storage device by executing a first program phase to put the cell in an intermediate state, followed by a second program phase to put the cell in a final state.

21. The apparatus of claim 13, wherein setting a physical address for storing data associated with the write command further comprises setting the physical page for storing data to the upper page, in response to determining that reliability of storing data in the lower page has decreased below a threshold.

22. A system for storing information in a storage device comprising one or more multi-level memory cells, the system comprising:
    a driver configured to receive a write command from a client, the write command comprising a logical block address;
    a mapping logic module configured to map the logical block address received from the client to one or more page pairs of the storage device, wherein each page pair comprises a lower page associated with a least significant bit (LSB) of a plurality of multi-level cells in the storage device, and an upper page associated with a most significant bit (MSB) of the multi-level cells;

the mapping logic further configured to set a physical address for storing data associated with the write command to the physical address for the lower pages of the page pair; and a hardware controller configured to write data associated with the write command received from the client to the physical address supplied by the mapping logic module.

23. The system of claim 22, wherein the multi-level memory cells store n bits per storage cell by way of $2^n$ progressively increasing voltage states, and wherein n bits of the multi-level memory cells are organized into page tuples in which each bit of the multi-level memory cell is addressable in a distinct page of the page tuple.

24. The system of claim 22, wherein n equals 2 and the page tuple comprises a page pair in which the lowest page of the page pair corresponds to voltage states that are less than the maximum voltage state for the multi-level memory cells.

25. The system of claim 24, wherein the multi-level memory cells support four progressively increasing voltage states, and wherein the lower pages correspond to the first and third voltage states.

* * * * *